(12) United States Patent
Watanabe et al.

(10) Patent No.: US 12,315,740 B2
(45) Date of Patent: May 27, 2025

(54) SEMICONDUCTOR DEVICE AND METHOD FOR MANUFACTURING THEREOF

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Kenta Watanabe, Nisshin (JP); Takashi Okawa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 486 days.

(21) Appl. No.: 17/833,307

(22) Filed: Jun. 6, 2022

(65) Prior Publication Data
US 2022/0406614 A1    Dec. 22, 2022

(30) Foreign Application Priority Data
Jun. 17, 2021  (JP) .................................. 2021-100862

(51) Int. Cl.
*H01L 21/324*    (2006.01)
*H01L 21/02*    (2006.01)
*H10D 62/85*    (2025.01)

(52) U.S. Cl.
CPC ...... *H01L 21/3245* (2013.01); *H01L 21/0254* (2013.01); *H10D 62/8503* (2025.01)

(58) Field of Classification Search
None
See application file for complete search history.

(56) References Cited

U.S. PATENT DOCUMENTS

2005/0173739 A1 * 8/2005 Kusumoto ............ H01L 29/812
                                                                257/280
2017/0077830 A1    3/2017 Fujii et al.

FOREIGN PATENT DOCUMENTS

JP    2017-108080 A    6/2017

OTHER PUBLICATIONS

U.S. Appl. No. 17/832,809, filed Jun. 6, 2022, Okawa et al.

* cited by examiner

*Primary Examiner* — William C Trapanese
(74) *Attorney, Agent, or Firm* — Posz Law Group, PLC

(57) ABSTRACT

A semiconductor device includes: a compound semiconductor layer having a first compound semiconductor layer and a second compound semiconductor layer having a higher melting point than the first compound semiconductor layer; and an insulation gate on the second compound semiconductor layer. The compound semiconductor layer further includes: a drift region; a source region; and a body region between the drift region and the source region. The insulation gate faces the body region. The body region bridges over both the first compound semiconductor layer and the second compound semiconductor layer.

18 Claims, 10 Drawing Sheets

SEMICONDUCTOR DEVICE AND METHOD FOR MANUFACTURING THEREOF

CROSS REFERENCE TO RELATED APPLICATION

The present application claims the benefit of priority from Japanese Patent Application No. 2021-100862 filed on Jun. 17, 2021. The entire disclosure of the above application is incorporated herein by reference.

TECHNICAL FIELD

The present disclosure relates to a semiconductor device and a manufacturing method of a semiconductor device.

BACKGROUND

It may be difficult to form a highly active p type diffusion region in a nitride semiconductor and a compound semiconductor such as gallium oxide. For example, in the case of a nitride semiconductor, a heat treatment of 1200° C. or higher is required to activate the p type dopant. However, when such a high temperature heat treatment is performed, nitrogen may be released from the surface of the nitride semiconductor layer, and pits may be formed on the surface of the nitride semiconductor layer. Therefore, high-temperature heat treatment may not be performed, and it may be difficult to form a highly active p type diffusion region.

SUMMARY

According to an example, a semiconductor device includes: a compound semiconductor layer having a first compound semiconductor layer and a second compound semiconductor layer having a higher melting point than the first compound semiconductor layer; and an insulation gate on the second compound semiconductor layer. The compound semiconductor layer further includes: a drift region; a source region; and a body region between the drift region and the source region. The insulation gate faces the body region. The body region bridges over both the first compound semiconductor layer and the second compound semiconductor layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
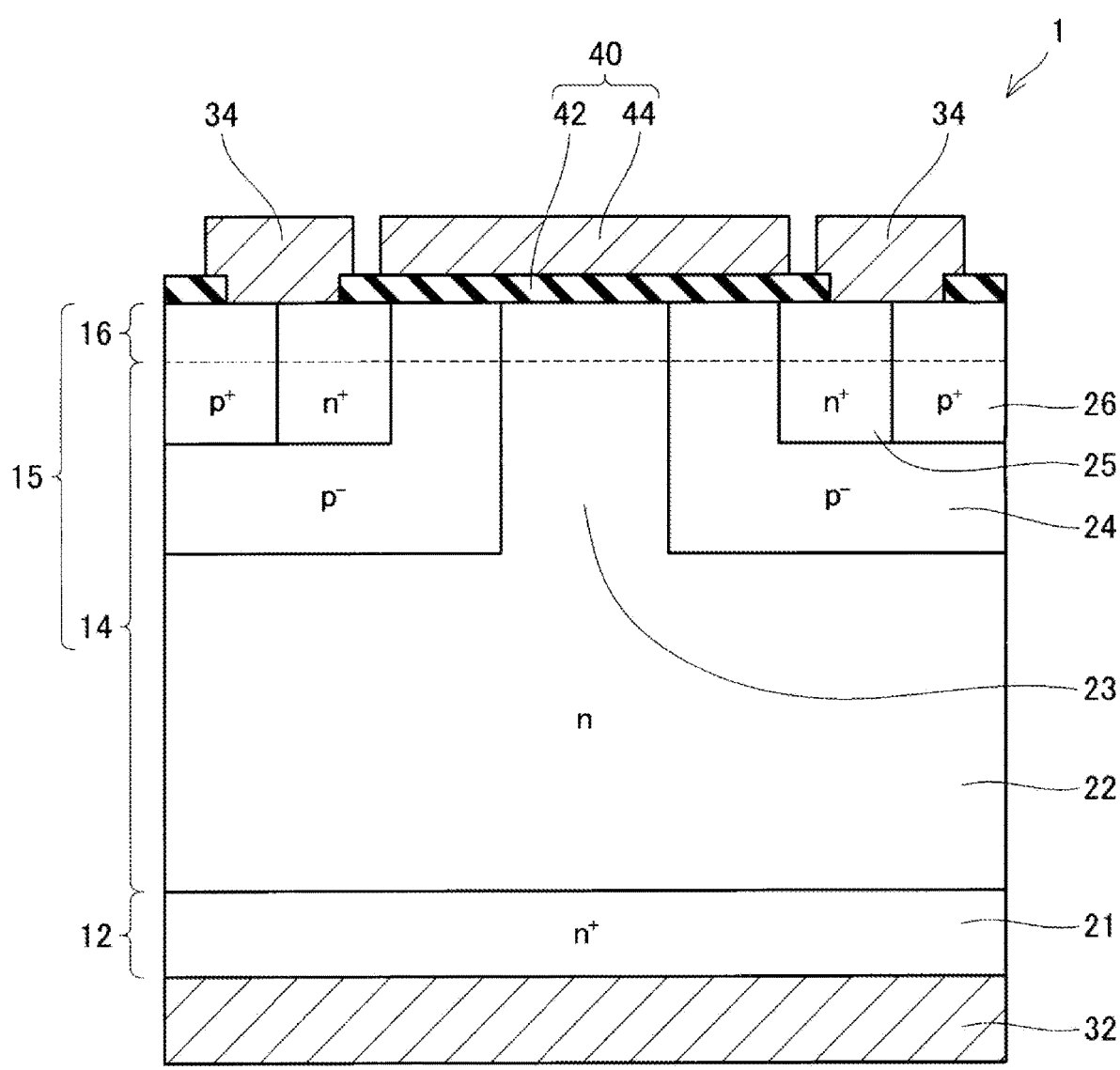
FIG. 1 is a diagram schematically showing a cross-sectional view of a part of a semiconductor device according to an embodiment of the present disclosure.

A conceivable technique proposes a technique for forming a cap layer made of a high melting point material such as aluminum nitride on a nitride semiconductor layer. By using such a cap layer, high-temperature heat treatment can be performed while suppressing nitrogen leakage, so that a highly active p type diffusion region can be formed.

In the technique using the cap layer, the cap layer is removed by using the etching technique after performing the high temperature heat treatment. However, the etching may be insufficient and the cap layer may remain. In particular, if the cap layer remains on the channel region, there is a concern that the threshold voltage may be lowered because the cap layer is n type or i type.

The semiconductor device disclosed in the present embodiments includes: a compound semiconductor layer having a first compound semiconductor layer and a second compound semiconductor layer; and an insulation gate arranged on the second compound semiconductor layer of the compound semiconductor layer. In the compound semiconductor layer, the second compound semiconductor layer is disposed on the first compound semiconductor layer and has a higher melting point than the first compound semiconductor layer. The compound semiconductor layer includes: a drift region having a first conductive type; a source region having the first conductive type; and a body region having a second conductive type and disposed between the drift region and the source region at a position where the body region is exposed on an upper surface of the compound semiconductor layer. The insulation gate faces the body region located between the drift region and the source region. The body region located between the drift region and the source region is arranged so as to bridge over both the first compound semiconductor layer and the second compound semiconductor layer.

In the semiconductor device, the second compound semiconductor layer that functions as a cap layer remains. However, in the semiconductor device, the body region, that is, the channel region located between the drift region and the source region is formed so as to straddle both the first compound semiconductor layer and the second compound semiconductor layer. Therefore, even if the second compound semiconductor layer that functions as a cap layer remains, the second compound semiconductor layer is configured as the channel region, so that the decrease in the threshold voltage of the semiconductor device is suppressed.

The method for manufacturing a semiconductor device disclosed in the present embodiments includes: a first step of preparing a compound semiconductor layer having a first compound semiconductor layer having a first conductive type and a second compound semiconductor layer having a first conductive type or an i type, wherein, in the first step, the second compound semiconductor layer is provided on the first compound semiconductor layer and has a higher melting point than the first compound semiconductor layer; a second step of ion-implanting a second conductive type impurity into an upper layer portion of the compound semiconductor layer to form a body region, wherein, in the second step, the body region is disposed between a drift region having the first conductive type and a source region having the first conductive type and arranged so as to bridge over both the first compound semiconductor layer and the second compound semiconductor layer; a third step of heat-treating the compound semiconductor layer after performing the second step; and a fourth step of forming an insulation gate on the second compound semiconductor layer, the insulation gate facing the body region located between the drift region and the source region.

In the above manufacturing method, the body region, that is, the channel region, located between the drift region and the source region is formed in the second compound semiconductor layer that functions as a cap layer, and the insulation gate is formed on the second compound semiconductor layer without removing the second compound semiconductor layer. Therefore, in the above manufacturing method, since the second nitride semiconductor layer can be configured as the channel region, the semiconductor device is manufactured with suppressing the reduction of the threshold voltage even if the second compound semiconductor layer functioning as a cap layer remains.

Hereinafter, the semiconductor device disclosed in the present disclosure and the manufacturing method thereof will be described with reference to the drawings. In each drawing, for the purpose of clarification of illustration, common components may be designated by a reference only to one of them.

First Embodiment

As shown in FIG. 1, the semiconductor device 1 includes a compound semiconductor substrate 12, a compound semiconductor layer 15, a drain electrode 32 provided so as to cover the lower surface of the compound semiconductor substrate 12, a source electrode 34 provided so as to cover a part of the upper surface of the compound semiconductor layer 15, and a planar type insulation gate 40 provided so as to cover a part of the upper surface of the compound semiconductor layer 15.

The compound semiconductor substrate 12 may not be particularly limited, but may be, for example, a gallium nitride substrate (GaN substrate). As will be described later, the compound semiconductor substrate 12 is a base substrate for epitaxially growing the compound semiconductor layer 15. Further, the compound semiconductor substrate 12 includes an n type dopant at a high concentration, and is also a portion that functions as a drain region 21. The n type dopant may not be particularly limited, but may be, for example, silicon. The drain region 21 is in ohmic contact with the drain electrode 32.

The compound semiconductor layer 15 is provided so as to be in contact with the upper surface of the compound semiconductor substrate 12, and is configured by stacking the first compound semiconductor layer 14 and the second compound semiconductor layer 16. The broken line shown in the drawings indicates the interface between the first compound semiconductor layer 14 and the second compound semiconductor layer 16. The compound semiconductor layer 15 may not be particularly limited, but may be made of, for example, a nitride semiconductor. As an example, the first compound semiconductor layer 14 may be a gallium nitride layer (i.e., a GaN layer), and the second compound semiconductor layer 16 may be an aluminum nitride layer (i.e., an AlN layer). The first compound semiconductor layer 14 is provided so as to be in contact with the upper surface of the compound semiconductor substrate 12, and is arranged between the compound semiconductor substrate 12 and the second compound semiconductor layer 16. The second compound semiconductor layer 16 is provided so as to be in contact with the upper surface of the first compound semiconductor layer 14, and is arranged at a position exposed on the upper surface of the compound semiconductor layer 15.

The compound semiconductor layer 15 has an n type drift region 22, a $p^-$ type body region 24, an $n^+$ type source region 25, and a $p^+$ type body contact region 26.

The drift region 22 is provided so as to be in contact with the upper surface of the drain region 21, and is arranged between the drain region 21 and the body region 24. The drift region 22 also has a JFET region 23 provided so as to be sandwiched between the body regions 24 in the plane direction of the compound semiconductor layer 15. In other words, the JFET region 23 is a part of the drift region 22 provided so as to penetrate the body region 24 from the upper surface of the compound semiconductor layer 15. The JFET region 23 is provided at a position exposed on the upper surface of the compound semiconductor layer 15 and is in contact with the insulation gate 40. The JFET region 23 is arranged so as to straddle both the first compound semiconductor layer 14 and the second compound semiconductor layer 16. The drift region 22 includes an n type dopant at a lower concentration than the drain region 21. The n type dopant may not be particularly limited, but may be, for example, silicon.

The body region 24 is provided so as to be in contact with the upper surface of the drift region 22, and is arranged adjacent to the side surface of the JFET region 23. A part of the body region 24 is provided at a position exposed on the upper surface of the compound semiconductor layer 15 and is in contact with the insulation gate 40. A part of the body region 24 is arranged so as to straddle both the first compound semiconductor layer 14 and the second compound semiconductor layer 16. The body region 24 includes a p type dopant. The p type dopant may not be particularly limited, but may be, for example, magnesium.

The source region 25 is provided so as to be in contact with the upper surface of the body region 24, and is separated from the drift region 22 by the body region 24. The source region 25 is provided at a position exposed on the upper surface of the compound semiconductor layer 15 and is in contact with the insulation gate 40. The source region 25 is arranged so as to straddle both the first compound semiconductor layer 14 and the second compound semiconductor layer 16. The source region 25 includes an n type dopant at a higher concentration than the drift region 22. The n type dopant may not be particularly limited, but may be, for example, silicon. The source region 25 is in ohmic contact with the source electrodes 34.

The body contact region 26 is provided so as to be in contact with the upper surface of the body region 24. The body contact region 26 is provided at a position exposed on the upper surface of the compound semiconductor layer 15, and is arranged so as to straddle both the first compound semiconductor layer 14 and the second compound semiconductor layer 16. The body contact region 26 includes a p type dopant at a higher concentration than the body region 24. The p type dopant may not be particularly limited, but may be, for example, magnesium. The body contact region 26 is in ohmic contact with the source electrode 34.

The insulation gate 40 is provided so as to be in contact with a part of the upper surface of the second compound semiconductor layer 16 of the compound semiconductor layer 15, and has a silicon oxide gate insulation film 42 and a polysilicon gate electrode 44. The gate electrode 44 faces the body region 24 at a position separating the JFET region 23, which is a part of the drift region 22, and the source region 25, and the JFET region 23 via the gate insulation film 42.

Next, the operation of the semiconductor device 1 will be described. At the time of use, for example, a positive voltage is applied to the drain electrode 32, and the source electrode 34 is grounded. When a positive voltage higher than the gate threshold voltage is applied to the gate electrode 44, an inversion layer is formed in the part of the body region 24 separating the JFET region 23 and the source region 25, that is, in the channel region. Electrons flow from the source region 25 into the JFET region 23 via the inversion layer formed in the channel region. The electrons flowing into the JFET region 23 flow vertically through the JFET region 23 and the drift region 22 and flow toward the drain electrode 32. As a result, the drain electrode 32 and the source electrode 34 become conductive, and the semiconductor device 1 turns on. When the gate electrode 44 is grounded, the inversion layer disappears and the semiconductor device 1 is turned off. In this way, the semiconductor device 1 can execute a switching operation of switching on and off between the drain electrode 32 and the source electrode 34 based on the voltage applied to the gate electrode 44.

(Manufacturing Method of Semiconductor Device 1)

Figure 2:
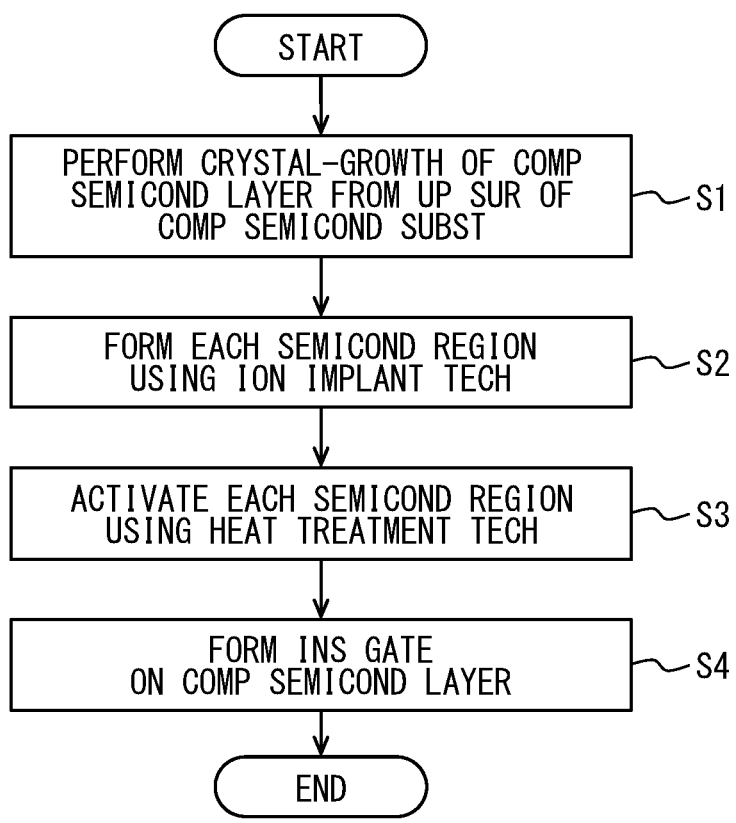
FIG. 2 is a diagram showing a manufacturing flow of a part of the semiconductor device of FIG. 1.
Figure 3:
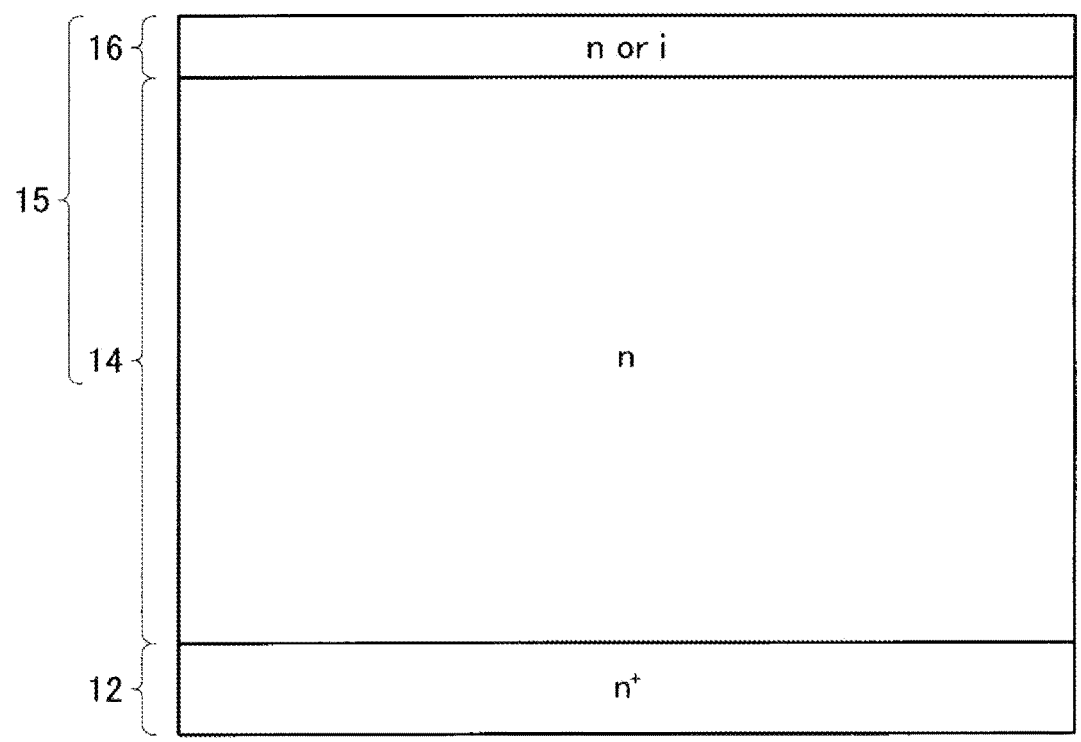
FIG. 3 is a diagram schematically showing a main part of a cross-sectional view in a manufacturing process of the method for manufacturing the semiconductor device in FIG. 1.
Figure 4:
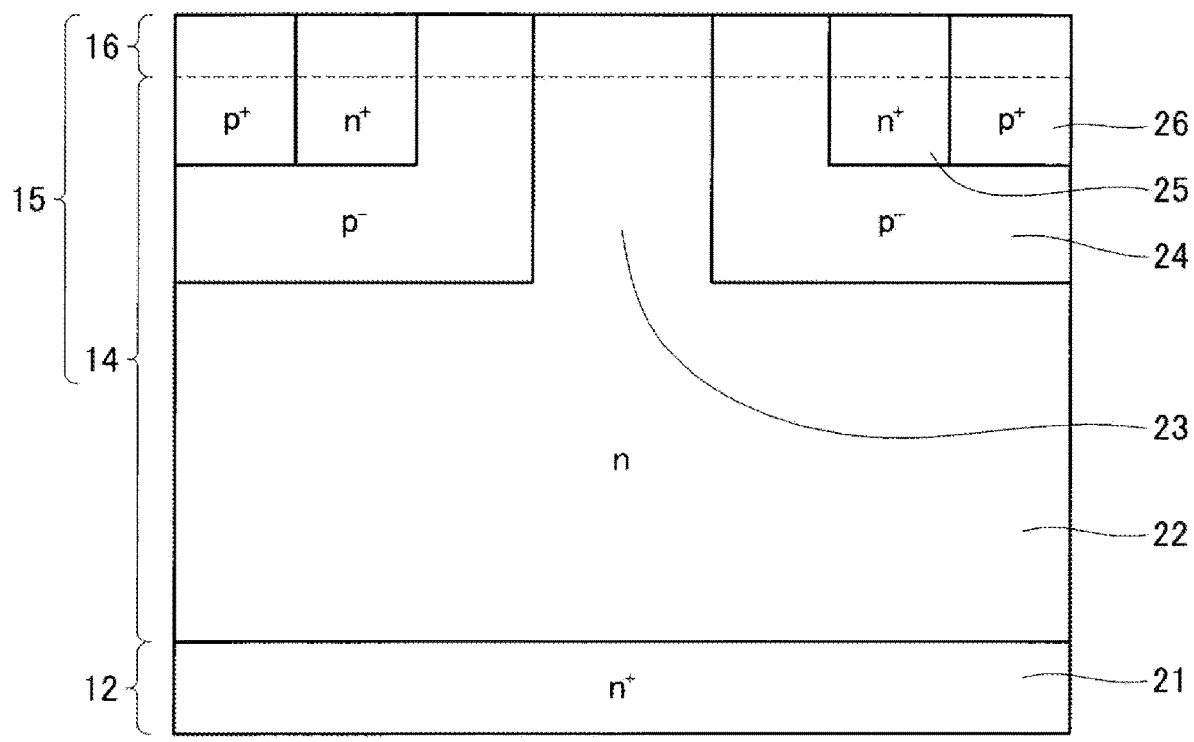
FIG. 4 is a diagram schematically showing a main part of a cross-sectional view in a manufacturing process of the method for manufacturing the semiconductor device in FIG. 1.
Figure 5:
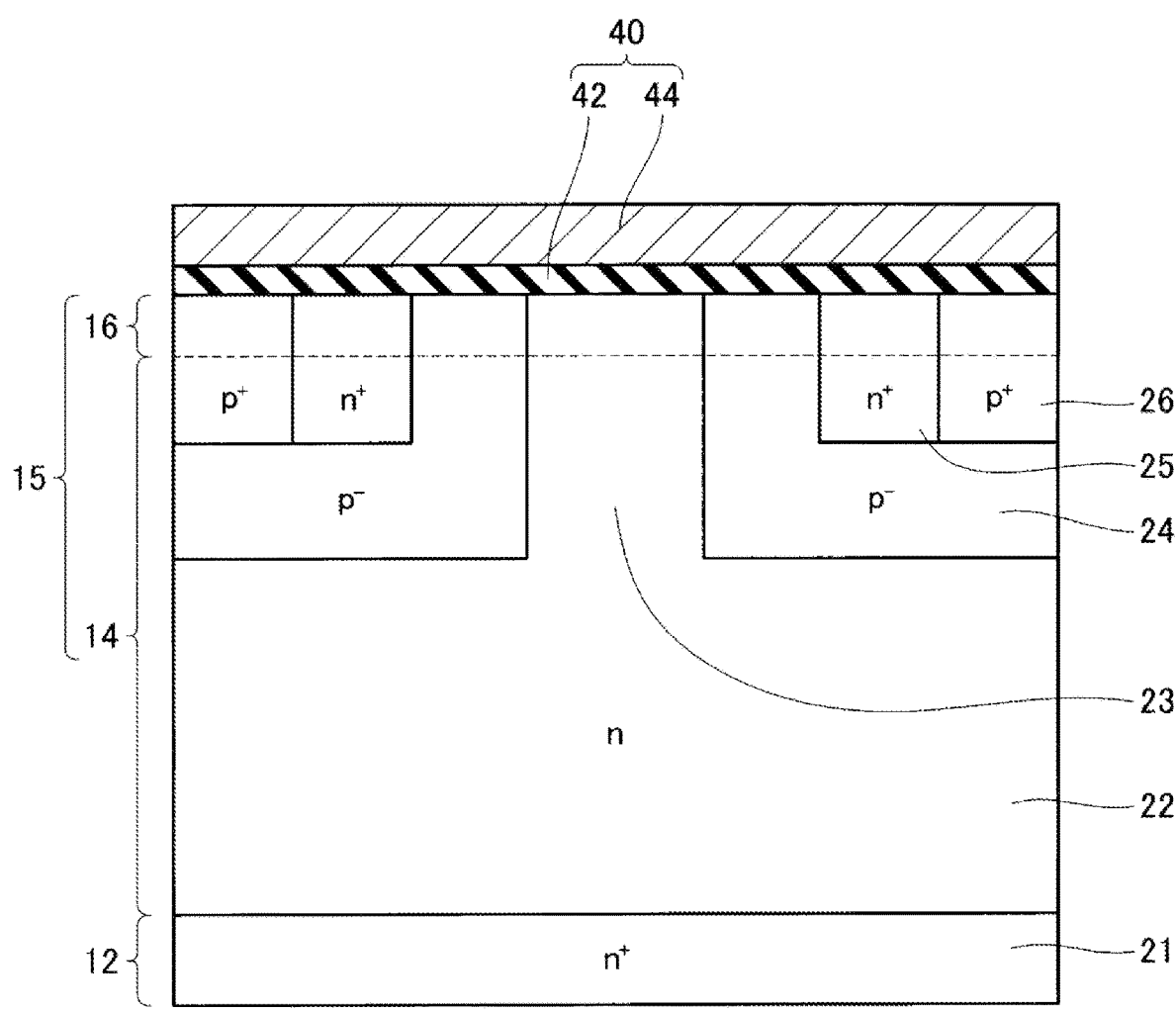
FIG. 5 is a diagram schematically showing a main part of a cross-sectional view in a manufacturing process of the method for manufacturing the semiconductor device in FIG. 1.

FIG. 2 is a manufacturing flow showing the flow of a part of the steps for manufacturing the semiconductor device 1. FIGS. 3 to 5 are cross-sectional views of main parts in the manufacturing process corresponding to the manufacturing flow of FIG. 2.

First, as shown in FIG. 3, using an epitaxial growth technique, the first compound semiconductor layer 14 is crystal-grown from the upper surface of the compound semiconductor substrate 12, and further, the second compound semiconductor layer 16 is crystal-grown from the upper surface of the first compound semiconductor layer 14 to form the compound semiconductor layer 15 (at step S1 in FIG. 2). The first compound semiconductor layer 14 is formed by crystal growth so as to include an n type dopant. The second compound semiconductor layer 16 may be formed by crystal growth so as to include an n type dopant, or may be formed by crystal growth without doping. The thickness of the second compound semiconductor layer 16 is 15 nm or less. When the thickness of the second compound semiconductor layer 16 is 15 nm or less, it is possible to prevent the second compound semiconductor layer 16 from being cracked due to the influence of the lattice constant difference between the first compound semiconductor layer 14 (in this example, the GaN layer) and the second compound semiconductor layer 16 (in this example, the AlN layer), so that the high-quality second compound semiconductor layer 16 is formed.

Next, as shown in FIG. 4, using an ion implantation technique, a p type dopant or an n type dopant is injected into a predetermined region of the upper layer portion of the compound semiconductor layer 15 to form a body region 24, a source region 25 and a body contact region 26 (at step S2 in FIG. 2). The order in which these semiconductor regions 24, 25, and 26 are formed may not be particularly limited. The dopant for forming these semiconductor regions 24, 25, and 26 is injected so as to straddle both the first compound semiconductor layer 14 and the second compound semiconductor layer 16. When the second compound semiconductor layer 16 is i type (i.e., intrinsic type), an n type dopant may be injected into the portion of the second compound semiconductor layer 16 corresponding to the JFET region 23.

Next, a heat treatment for activating these semiconductor regions 24, 25, and 26 is performed (at step S3 in FIG. 2). The temperature of the heat treatment may not be particularly limited, but may be, for example, 1200° C. or higher. By such a high temperature heat treatment, the injected dopant, particularly magnesium, which is a p type dopant, can be satisfactorily activated. Further, the second compound semiconductor layer 16 (in this example, the AlN layer) is made of a material having a higher melting point than the first compound semiconductor layer 14 (in this example, the GaN layer). Therefore, the second compound semiconductor layer 16 can function as a cap layer, suppresses nitrogen leakage from the upper surface of the compound semiconductor layer 15, and suppresses the formation of pits on the upper surface of the compound semiconductor layer 15.

Next, as shown in FIG. 5, the insulation gate 40 is formed on the compound semiconductor layer 15 (at step S4 in FIG. 2). Specifically, the gate insulation film 42 is formed so as to cover the upper surface of the second compound semiconductor layer 16 of the compound semiconductor layer 15 by using the vapor deposition technique. The vapor deposition technique may not be particularly limited, but an atomic layer deposition method or a plasma CVD method may be used. Next, a heat treatment technique is carried out to improve the film quality of the gate insulation film 42. The heat treatment temperature may be 800° C. or higher. Next, the gate electrode 44 is formed on the upper surface of the gate insulation film 42 by using the vapor deposition technique. Further, the gate insulation film 42 and the gate electrode 44 are processed by using the etching technique to form the insulation gate 40. After that, the semiconductor device 1 shown in FIG. 1 can be manufactured by forming the drain electrode 32 and the source electrode 34 by using a known manufacturing technique.

In the conventional manufacturing method using a cap layer, an n type or i type cap layer is formed after ion implantation into the compound semiconductor layer. Then, a heat treatment for activation is carried out. After the heat treatment, the cap layer is removed, and an insulation gate is formed on the compound semiconductor layer from which the cap layer has been removed. In such a conventional manufacturing method, there is a concern that the threshold voltage may be lowered when the n type or i type cap layer remains on the channel region. Further, if CMP technology is used so that the cap layer does not remain, there is a concern that the cost will increase and the channel region will be damaged.

In the manufacturing method disclosed herein, a diffusion region is also formed in the second compound semiconductor layer 16 that functions as a cap layer, and the insulation gate 40 is formed on the second compound semiconductor layer 16 without removing the second compound semiconductor layer 16. In particular, in this manufacturing method, a body region, that is, a channel region at a position separating the drift region 22 and the source region 25 is formed so as to straddle both the first compound semiconductor layer 14 and the second compound semiconductor layer 16. Therefore, in this manufacturing method, a part of the second compound semiconductor layer 16 can be configured as a channel region, so that even if the second compound semiconductor layer 16 that functions as a cap layer remains, it is possible to manufacture the semiconductor device 1 in which the reduction of the threshold voltage is suppressed.

Second Embodiment

Figure 6:
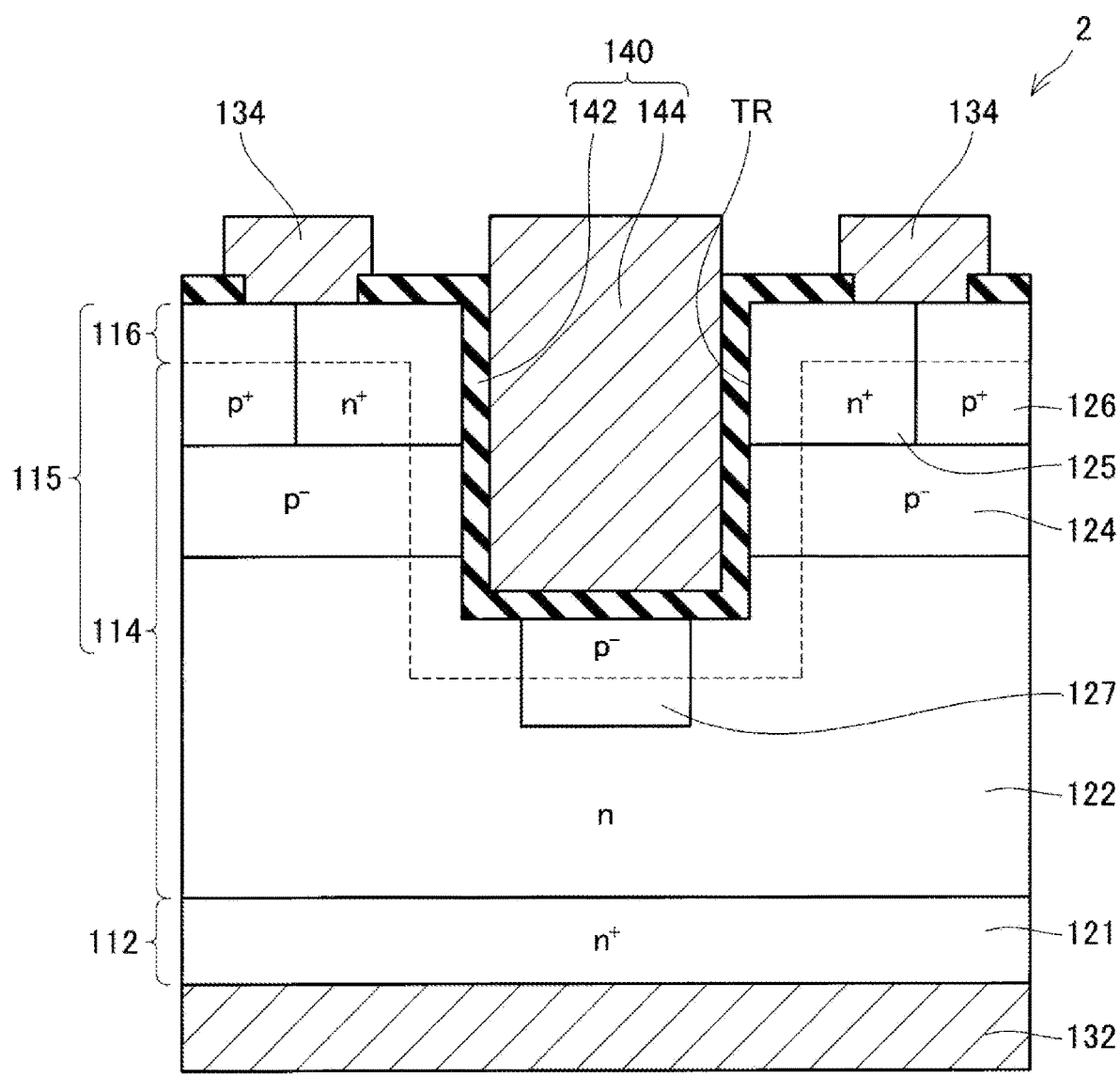
FIG. 6 is a diagram schematically showing a cross-sectional view of a part of another semiconductor device according to an embodiment of the present disclosure.

FIG. 6 shows a semiconductor device 2 which is a modification of the semiconductor device 1 shown in FIG. 1. For the components common to the semiconductor device 1 shown in FIG. 1, "1" may be added to the hundreds digit, and the description of these components may be omitted in order to avoid repeated explanations.

As shown in FIG. 6, the semiconductor device 2 is characterized by including a trench-type insulation gate 140 provided in a trench TR formed on the upper surface of the compound semiconductor layer 115. Similar to the semiconductor device 1 shown in FIG. 1, the compound semiconductor substrate 112 is a gallium nitride substrate (i.e., a GaN substrate), the first compound semiconductor layer 114 is a gallium nitride layer (i.e., a GaN layer), and the second compound semiconductor layer 116 is an aluminum nitride layer (i.e., an AlN layer).

The compound semiconductor layer 115 is formed by stacking the first compound semiconductor layer 114 and the second compound semiconductor layer 116. The broken line shown in the drawings indicates the interface between the first compound semiconductor layer 114 and the second compound semiconductor layer 116. The first compound semiconductor layer 114 is provided so as to be in contact with the upper surface of the compound semiconductor substrate 112, and is arranged between the compound semiconductor substrate 112 and the second compound semiconductor layer 116. The second compound semiconductor layer 116 is provided so as to be in contact with the upper surface of the first compound semiconductor layer 114, and is arranged at a position exposed on the upper surface of the compound semiconductor layer 115. In the present specification, the side surface and the bottom surface of the trench TR are also included in the upper surface of the compound semiconductor layer 115.

The compound semiconductor layer 115 includes an n type drift region 122, a p⁻ type body region 124, an n⁺ type source region 125, a p⁺ type body contact region 126, and a p⁻ type electric field relaxation region 127.

The drift region 122 is provided so as to be in contact with the upper surface of the drain region 121, and is arranged between the drain region 121 and the body region 124. A part of the drift region 122 is provided at a position exposed at a corner between the side surface and the bottom surface of the trench TR, and is in contact with the side surface and the bottom surface of the insulation gate 140. The drift region 122 at a position exposed at the corner between the side surface and the bottom surface of the trench TR is arranged so as to straddle both the first compound semiconductor layer 14 and the second compound semiconductor layer 16.

The body region 124 is provided so as to be in contact with the upper surface of the drift region 122. A part of the body region 124 is provided at a position exposed on the side surface of the trench TR, and is in contact with the side surface of the insulation gate 140. The body region 124 exposed on the side surface of the trench TR is arranged so as to straddle both the first compound semiconductor layer 14 and the second compound semiconductor layer 16.

The source region 125 is provided so as to be in contact with the upper surface of the body region 124, and is separated from the drift region 122 by the body region 124. The source region 125 is provided at a position exposed on the side surface of the trench TR, and is in contact with the side surface of the insulation gate 140. The source region 125 is arranged so as to straddle both the first compound semiconductor layer 14 and the second compound semiconductor layer 16.

The body contact region 126 is provided so as to be in contact with the upper surface of the body region 124. The body contact region 126 is provided at a position exposed on the upper surface of the compound semiconductor layer 115, and is arranged so as to straddle both the first compound semiconductor layer 114 and the second compound semiconductor layer 116.

The electric field relaxation region 127 is provided at a position exposed on the bottom surface of the trench TR, and is in contact with the bottom surface of the insulation gate 140. The electric field relaxation region 127 is arranged between the insulation gate 140 and the drift region 122, and is provided to relax the electric field on the bottom surface of the insulation gate 140. The electric field relaxation region 127 is arranged so as to straddle both the first compound semiconductor layer 114 and the second compound semiconductor layer 116. The electric field relaxation region 127 includes a p type dopant to the same extent as the body region 124. The p type dopant may not be particularly limited, but may be, for example, magnesium.

The insulation gate 140 is provided in the trench TR, and has a silicon oxide gate insulation film 142 and a polysilicon gate electrode 144. The gate insulation film 142 is provided so as to cover the side surface and the bottom surface of the trench TR. The gate electrode 144 is separated from the compound semiconductor layer 115 by the gate insulation film 142, and faces the body region 124 at a position separating the drift region 122 and the source region 125 via the gate insulation film 142.

Next, the operation of the semiconductor device 2 will be described. At the time of use, for example, a positive voltage is applied to the drain electrode 132, and the source electrode 134 is grounded. When a positive voltage higher than the gate threshold voltage is applied to the gate electrode 144, an inversion layer is formed in the body region 124 separating the drift region 122 and the source region 125, that is, in the channel region. Electrons flow from the source region 125 into the drift region 122 via the inversion layer formed in the channel region. The electrons flowing into the drift region 122 flow vertically through the drift region 122 and flow toward the drain electrode 132. As a result, the drain electrode 132 and the source electrode 134 become conductive, and the semiconductor device 2 turns on. When the gate electrode 144 is grounded, the inversion layer disappears and the semiconductor device 2 is turned off. In this way, the semiconductor device 2 can execute a switching operation of switching on and off between the drain electrode 132 and the source electrode 134 based on the voltage applied to the gate electrode 144.

(Manufacturing Method of Semiconductor Device 2)

Figure 7:
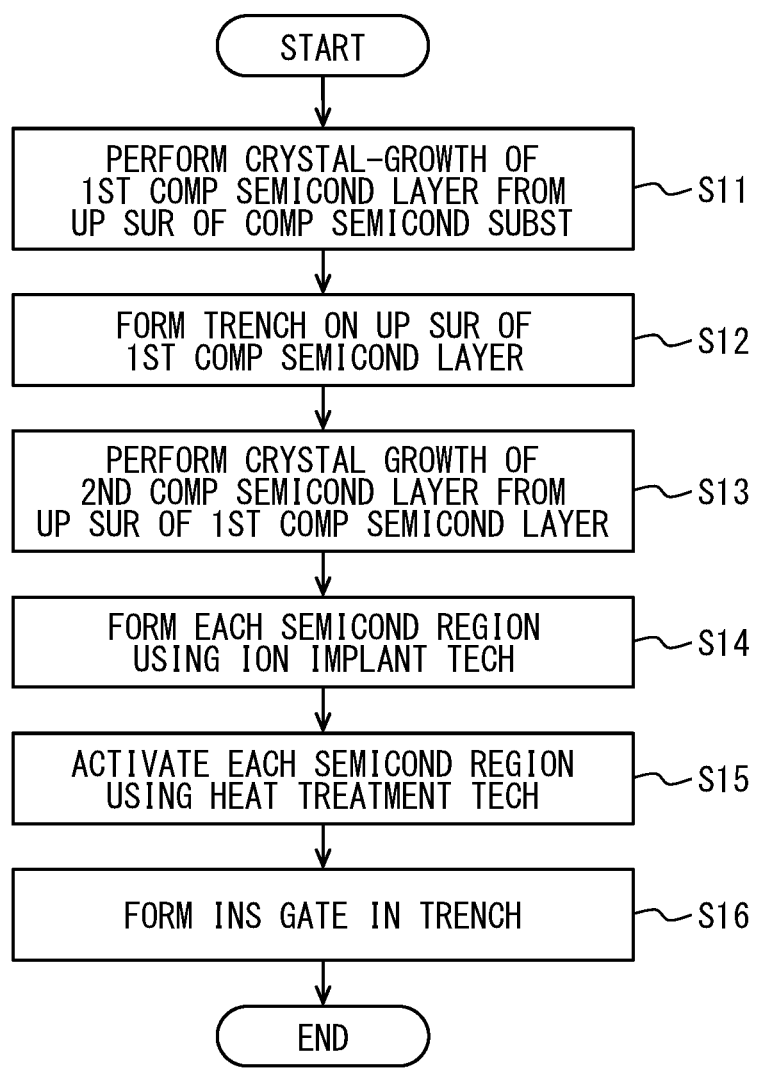
FIG. 7 is a diagram showing a manufacturing flow of a part of the semiconductor device of FIG. 6.

FIG. 7 is a manufacturing flow showing the flow of a part of the steps for manufacturing the semiconductor device 2. FIGS. 8 to 12 are cross-sectional views of main parts in the manufacturing process corresponding to the manufacturing flow of FIG. 7.

Figure 8:
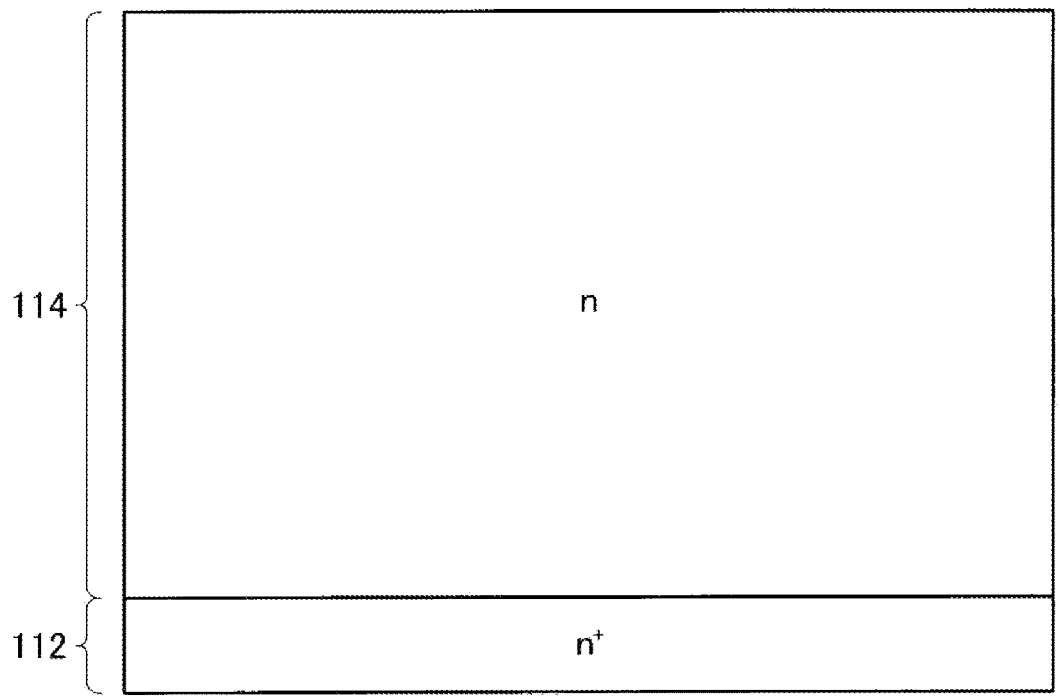
FIG. 8 is a diagram schematically showing a main part of a cross-sectional view in a manufacturing process of the method for manufacturing the semiconductor device in FIG. 6.

First, as shown in FIG. 8, the first compound semiconductor layer 114 is crystal-grown from the upper surface of the compound semiconductor substrate 112 by using the epitaxial growth technique (at step S11 in FIG. 7). The first compound semiconductor layer 14 is formed by crystal growth so as to include an n type dopant.

Figure 9:
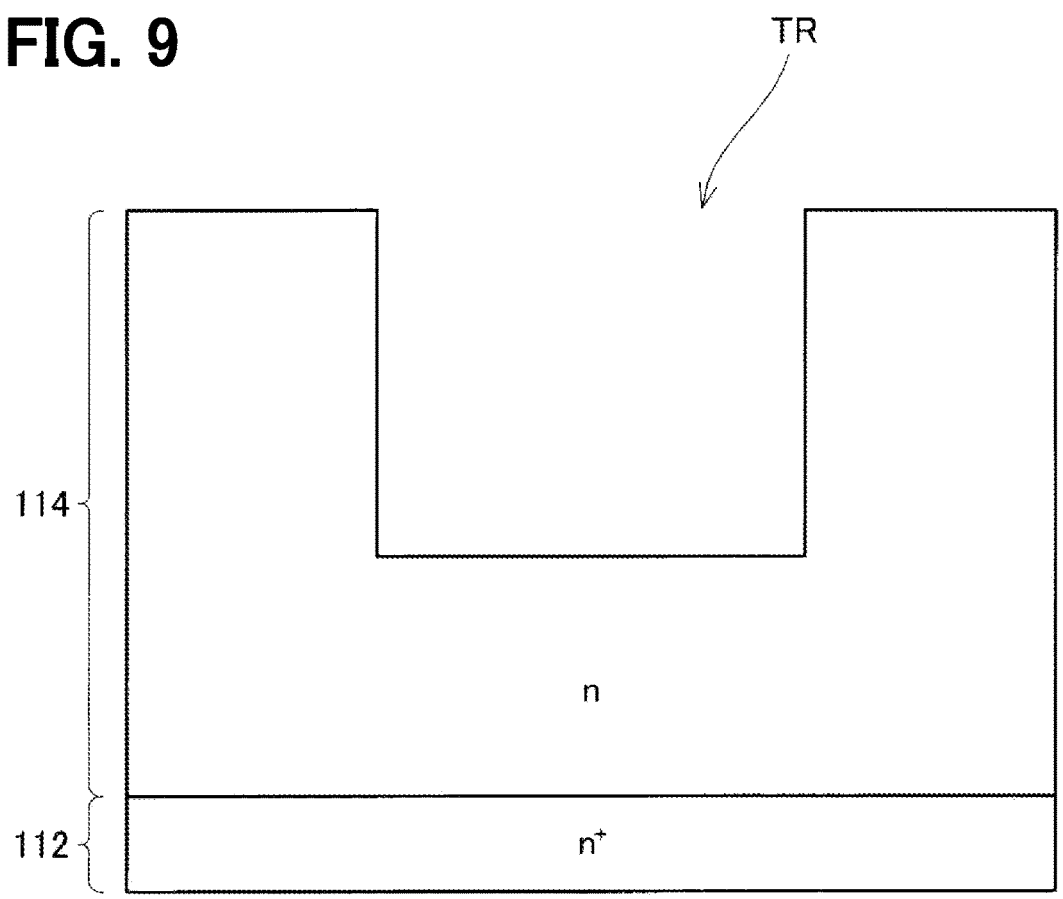
FIG. 9 is a diagram schematically showing a main part of a cross-sectional view in a manufacturing process of the method for manufacturing the semiconductor device in FIG. 6.

Next, as shown in FIG. 9, a trench TR extending from the upper surface to the deep part of the first compound semiconductor layer 114 is formed by using a photolithography technique and an etching technique (at step S12 in FIG. 7).

Figure 10:
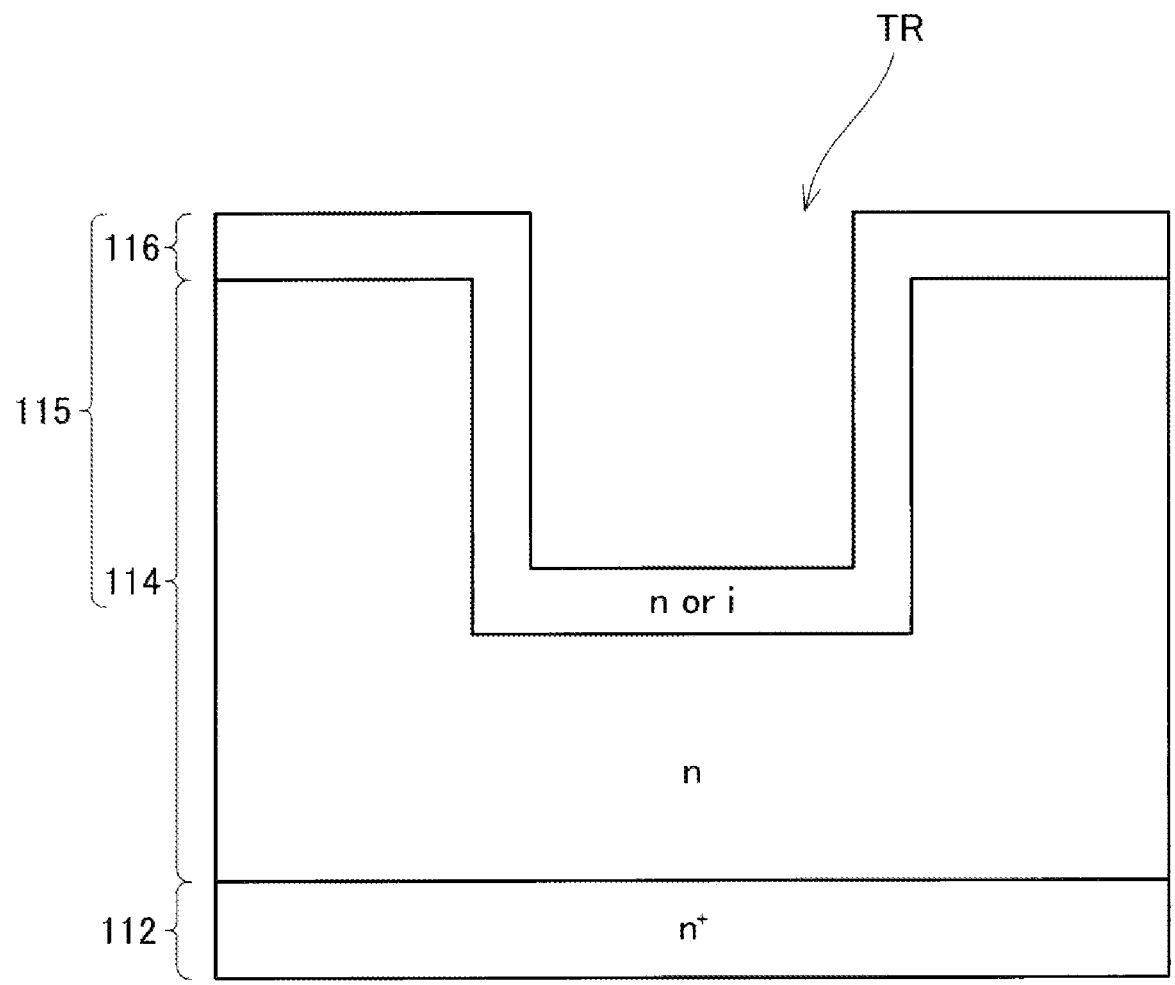
FIG. 10 is a diagram schematically showing a main part of a cross-sectional view in a manufacturing process of the method for manufacturing the semiconductor device in FIG. 6.

Next, as shown in FIG. 10, the second compound semiconductor layer 116 is crystal-grown from the upper surface of the first compound semiconductor layer 114 to form the compound semiconductor layer 115 by using the epitaxial growth technique (at step S13 of FIG. 7). The second compound semiconductor layer 116 is also formed in the trench TR. The second compound semiconductor layer 116 may be formed by crystal growth so as to include an n type dopant, or may be formed by crystal growth without doping. The thickness of the second compound semiconductor layer 116 is 15 nm or less. When the thickness of the second compound semiconductor layer 116 is 15 nm or less, it is possible to prevent the second compound semiconductor layer 116 from being cracked due to the influence of the lattice constant difference between the first compound semiconductor layer 114 (in this example, the GaN layer) and the second compound semiconductor layer 116 (in this example, the AlN layer), so that the high-quality second compound semiconductor layer 116 is formed.

Figure 11:
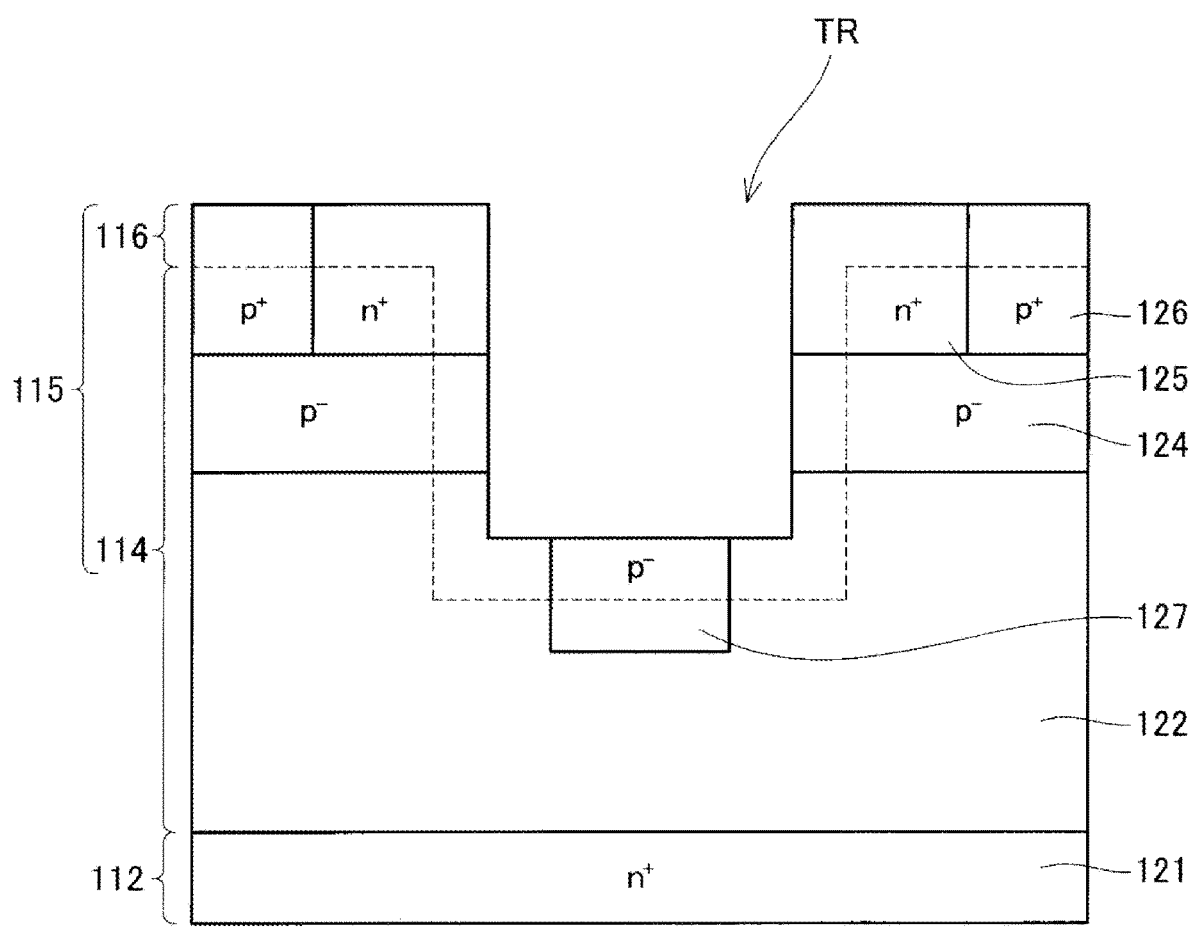
FIG. 11 is a diagram schematically showing a main part of a cross-sectional view in a manufacturing process of the method for manufacturing the semiconductor device in FIG. 6.

Next, as shown in FIG. 11, using an ion implantation technique, a p type dopant or an n type dopant is injected into a predetermined region of the upper layer portion of the compound semiconductor layer 115 to form a body region 124, a source region 125, a body contact region 126 and an electric field relaxation region 127 (at step S14 in FIG. 7). The order in which these semiconductor regions 124, 125, 126 and 127 are formed may not be particularly limited. The dopant for forming these semiconductor regions 124, 125, 126 and 127 is injected so as to straddle both the first compound semiconductor layer 114 and the second compound semiconductor layer 116.

Next, a heat treatment for activating these semiconductor regions 124, 125, 126 and 127 is performed (at step S15 in FIG. 7). The temperature of the heat treatment may not be particularly limited, but may be, for example, 1200° C. or higher. By such a high temperature heat treatment, the injected dopant, particularly magnesium, which is a p type dopant, can be satisfactorily activated. Further, the second compound semiconductor layer 116 (in this example, the AlN layer) is made of a material having a higher melting point than the first compound semiconductor layer 114 (in this example, the GaN layer). Therefore, the second compound semiconductor layer 116 can function as a cap layer, suppresses nitrogen leakage from the upper surface of the compound semiconductor layer 115, and suppresses the formation of pits on the upper surface of the compound semiconductor layer 115.

Figure 12:
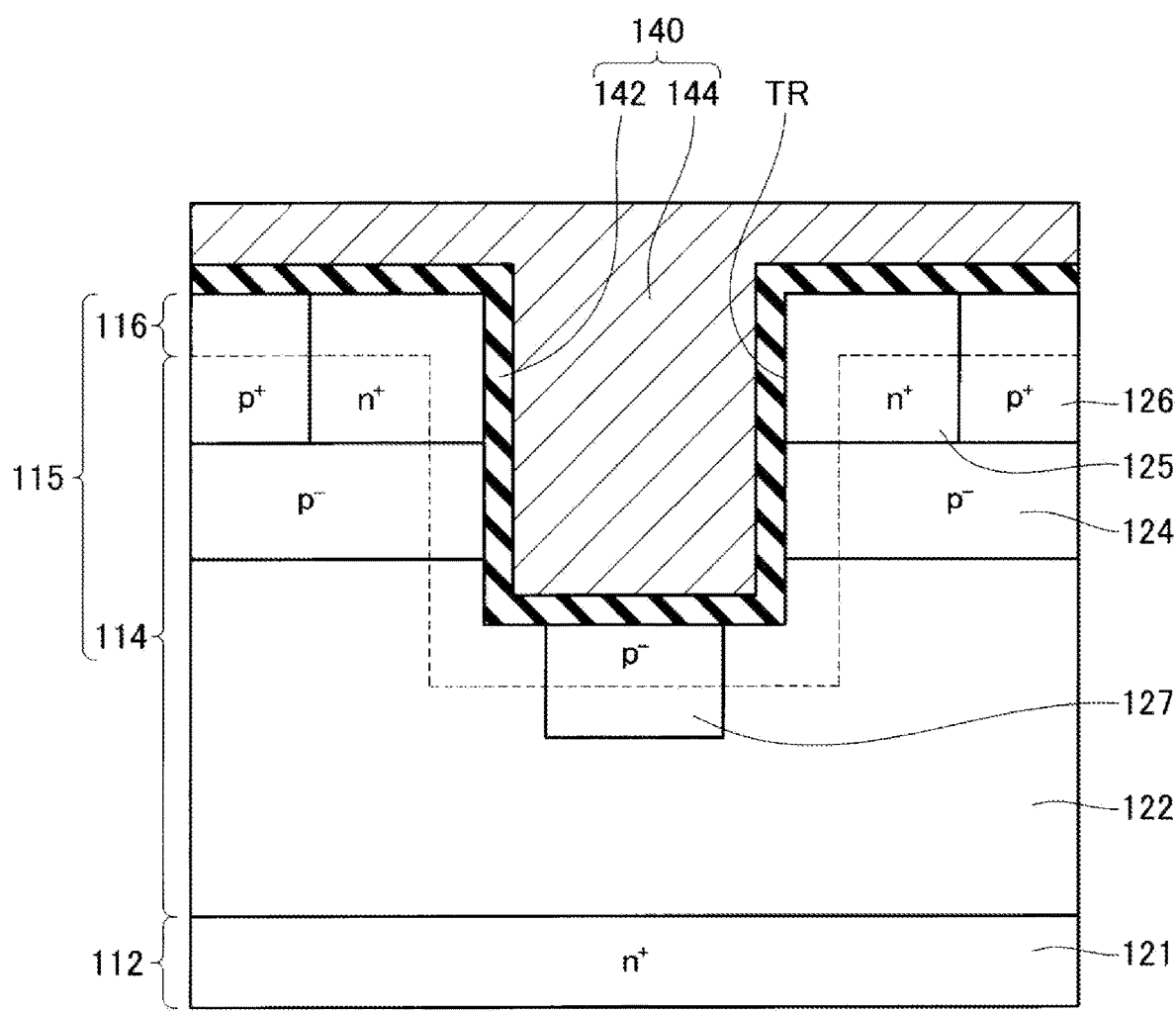
FIG. 12 is a diagram schematically showing a main part of a cross-sectional view in a manufacturing process of the method for manufacturing the semiconductor device in FIG. 6.

Next, as shown in FIG. 12, the insulation gate 140 is formed on the compound semiconductor layer 115, and the insulation gate 140 is arranged in the trench TR (at step S16 in FIG. 7). Specifically, a thin-film deposition technique is used to form a gate insulation film 142 so as to cover the upper surface of the second compound semiconductor layer 116 including the inside of the trench TR. Next, the gate electrode 144 is formed on the upper surface of the gate insulation film 142 by using the vapor deposition technique. Further, the gate insulation film 142 and the gate electrode 144 are processed by using the etching technique to form the insulation gate 140 in the trench TR. After that, the semiconductor device 2 shown in FIG. 7 can be manufactured by forming the drain electrode 132 and the source electrode 134 by using a known manufacturing technique.

Also in this manufacturing method, a part of the body region 124 as the channel region is formed so as to straddle both the first compound semiconductor layer 14 and the second compound semiconductor layer 16. Therefore, in this manufacturing method, a part of the second compound semiconductor layer 116 can be configured as a channel region, so that even if the second compound semiconductor layer 116 that functions as a cap layer remains, it is possible to manufacture the semiconductor device 2 in which the reduction of the threshold voltage is suppressed.

The features of the techniques disclosed in the present disclosure are summarized below. It should be noted that the technical elements described below are independent technical elements and exhibit technical usefulness alone or in various combinations, and are not limited to the combinations described in the present description at the time of filing.

The semiconductor device disclosed in the present disclosure includes: a compound semiconductor layer having a first compound semiconductor layer and a second compound semiconductor layer; and an insulation gate disposed on the second compound semiconductor layer, and, in the compound semiconductor layer, the second compound semiconductor layer is disposed on the first compound semiconductor layer, and has a higher melting point than the first compound semiconductor layer. The material of the compound semiconductor layer may not be particularly limited, and may be, for example, a nitride semiconductor or gallium oxide. When the material of the compound semiconductor layer is a nitride semiconductor, the material of the first compound semiconductor layer may be gallium nitride, and the material of the second compound semiconductor layer may be aluminum nitride. The compound semiconductor layer includes: a drift region having a first conductive type; a source region having the first conductive type; and a body region having a second conductive type and disposed between the drift region and the source region at a position where the body region is exposed on an upper surface of the compound semiconductor layer. The insulation gate faces the body region located between the drift region and the source region. The body region located between the drift region and the source region is arranged so as to bridge over both the first compound semiconductor layer and the second compound semiconductor layer.

In the semiconductor device, when the material of the first compound semiconductor layer is gallium nitride and the material of the second compound semiconductor layer is aluminum nitride, the thickness of the second compound semiconductor layer may be 15 nm or less.

The insulation gate of the semiconductor device may be a planar type or a trench type. When the insulation gate is a planar type, the drift region is arranged at a position exposed on the upper surface of the compound semiconductor layer, and a first conductive type JFET region may be arranged adjacent to the body region. In this case, the insulation gate may face the body region located between the JFET region and the source region. When the insulation gate is a trench type, a trench (TR) may be formed on the upper surface of the compound semiconductor layer. The body region located between the drift region and the source region may be arranged at a position exposed on the side surface of the trench. In this case, the insulation gate may be provided in the trench.

The method for manufacturing a semiconductor device disclosed in the present disclosure includes: a first step of preparing a compound semiconductor layer having a first compound semiconductor layer having a first conductive type and a second compound semiconductor layer having a first conductive type or an i type, wherein, in the first step, the second compound semiconductor layer is provided on the first compound semiconductor layer and has a higher melting point than the first compound semiconductor layer; a second step of ion-implanting a second conductive type impurity into an upper layer portion of the compound semiconductor layer to form a body region, wherein, in the second step, the body region is disposed between a drift region having the first conductive type and a source region having the first conductive type and arranged so as to bridge over both the first compound semiconductor layer and the second compound semiconductor layer; a third step of heat-treating the compound semiconductor layer after performing the second step; and a fourth step of forming an insulation gate on the second compound semiconductor layer, the insulation gate facing the body region located between the drift region and the source region. The material of the compound semiconductor layer may not be particularly limited, and may be, for example, a nitride semiconductor or gallium oxide. When the material of the compound semiconductor layer is a nitride semiconductor, the material of the first compound semiconductor layer may be gallium nitride, and the material of the second compound semiconductor layer may be aluminum nitride.

In the manufacturing method of the semiconductor device, when the material of the first compound semiconductor layer is gallium nitride and the material of the second compound semiconductor layer is aluminum nitride, the thickness of the second compound semiconductor layer may be 15 nm or less. When the thickness of the second compound semiconductor layer is 15 nm or less, cracks are suppressed in the second compound semiconductor layer due to the influence of the lattice constant difference between the first compound semiconductor layer and the second compound semiconductor layer, and the second compound semiconductor layer is formed with good quality.

In the method for manufacturing a semiconductor device, when the material of the compound semiconductor layer is a nitride semiconductor, the heat treatment temperature in the third step may be 1200° C. or higher. Dopants can be effectively activated.

In the above manufacturing method, the first step may include: a step of crystal-growing the first compound semiconductor layer from the surface of the compound semiconductor substrate; and a step of crystal-growing the second compound semiconductor layer from the surface of the first compound semiconductor layer. The second compound semiconductor layer that functions as a cap layer may be formed prior to ion implantation.

Although specific examples of the present disclosure have been described in detail above, these are merely examples and do not limit the scope of the present description. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A semiconductor device comprising:
a compound semiconductor layer having a first compound semiconductor layer and a second compound semiconductor layer that is disposed on the first compound semiconductor layer, and has a higher melting point than the first compound semiconductor layer; and
an insulation gate arranged on the second compound semiconductor layer, wherein:
the compound semiconductor layer further includes:
a drift region having a first conductive type;
a source region having the first conductive type; and
a body region having a second conductive type, arranged between the drift region and the source region, and disposed at a position exposed on an upper surface of the compound semiconductor layer;
the insulation gate faces the body region located between the drift region and the source region; and
the body region located between the drift region and the source region is arranged so as to bridge over both the first compound semiconductor layer and the second compound semiconductor layer.

2. The semiconductor device according to claim 1, wherein:
a material of the compound semiconductor layer is a nitride semiconductor.

3. The semiconductor device according to claim 2, wherein:
a material of the first compound semiconductor layer is gallium nitride; and
a material of the second compound semiconductor layer is aluminum nitride.

4. The semiconductor device according to claim 3, wherein:
a thickness of the second compound semiconductor layer is 15 nm or less.

5. The semiconductor device according to claim 1, wherein:
the drift region is arranged at a position exposed on an upper surface of the compound semiconductor layer, and has a JFET region having the first conductive type and disposed adjacent to the body region; and
the insulation gate is a planar type and faces the body region located between the JFET region and the source region.

6. The semiconductor device according to claim 1, further comprising:
a trench disposed on an upper surface of the compound semiconductor layer, wherein:
the body region located between the drift region and the source region is arranged at a position exposed on a side surface of the trench; and
the insulation gate is a trench type and is provided in the trench.

7. The semiconductor device according to claim 1, wherein:

each of the source region and the drift region are arranged so as to bridge over both the first compound semiconductor layer and the second compound semiconductor layer.

8. The semiconductor device according to claim 1, wherein:
the body region is arranged so as to straddle both the first compound semiconductor layer and the second compound semiconductor layer.

9. The semiconductor device according to claim 1, wherein:
each of the source region and the drift region are arranged so as to straddle both the first compound semiconductor layer and the second compound semiconductor layer.

10. A method for manufacturing a semiconductor device comprising:
preparing a compound semiconductor layer having a first compound semiconductor layer having a first conductive type and a second compound semiconductor layer having a first conductive type or an i type, wherein, in the preparing of the compound semiconductor layer, the second compound semiconductor layer is provided on the first compound semiconductor layer and has a higher melting point than the first compound semiconductor layer;
ion-implanting a second conductive type impurity into an upper layer portion of the compound semiconductor layer to form a body region, wherein, in the ion-implanting of the second conductive type impurity, the body region is disposed between a drift region having the first conductive type and a source region having the first conductive type and arranged so as to bridge over both the first compound semiconductor layer and the second compound semiconductor layer;
performing a heat treatment of the compound semiconductor layer after the ion-implanting of the second conductive type impurity; and
forming an insulation gate on the second compound semiconductor layer, the insulation gate facing the body region located between the drift region and the source region.

11. The method for manufacturing the semiconductor device according to claim 10, wherein:
a material of the compound semiconductor layer is a nitride semiconductor.

12. The method for manufacturing the semiconductor device according to claim 11, wherein:
a material of the first compound semiconductor layer is gallium nitride; and
a material of the second compound semiconductor layer is aluminum nitride.

13. The method for manufacturing the semiconductor device according to claim 12, wherein:
a thickness of the second compound semiconductor layer is 15 nm or less.

14. The method for manufacturing the semiconductor device according to claim 11, wherein:
a heat treatment temperature in the performing of the heat treatment is 1200° C. or higher.

15. The method for manufacturing the semiconductor device according to claim 10, wherein:
the preparing of the compound semiconductor layer includes:
a stage of crystal growth of the first compound semiconductor layer from a surface of the compound semiconductor substrate; and
a stage of crystal growth of the second compound semiconductor layer from a surface of the first compound semiconductor layer.

16. The method for manufacturing the semiconductor device according to claim 10, wherein:
each of the source region and the drift region are arranged so as to bridge over both the first compound semiconductor layer and the second compound semiconductor layer.

17. The semiconductor device according to claim 10, wherein:
the body region is arranged so as to straddle both the first compound semiconductor layer and the second compound semiconductor layer.

18. The semiconductor device according to claim 10, wherein:
each of the source region and the drift region are arranged so as to straddle both the first compound semiconductor layer and the second compound semiconductor layer.

* * * * *